(12) United States Patent
Bae et al.

(10) Patent No.: US 12,021,445 B2
(45) Date of Patent: Jun. 25, 2024

(54) OVERCURRENT PROTECTION DEVICE AND POWER CONVERSION DEVICE USING SAME

(71) Applicant: LS ELECTRIC CO., LTD., Anyang-si (KR)

(72) Inventors: Sun Ho Bae, Anyang-si (KR); Jae Ho Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 279 days.

(21) Appl. No.: 17/629,675

(22) PCT Filed: Mar. 12, 2020

(86) PCT No.: PCT/KR2020/003438
§ 371 (c)(1),
(2) Date: Jan. 24, 2022

(87) PCT Pub. No.: WO2021/015388
PCT Pub. Date: Jan. 28, 2021

(65) Prior Publication Data
US 2022/0286041 A1 Sep. 8, 2022

(30) Foreign Application Priority Data
Jul. 25, 2019 (KR) .................. 10-2019-0089982

(51) Int. Cl.
*H02M 1/32* (2007.01)
*H02M 1/00* (2006.01)
(Continued)

(52) U.S. Cl.
CPC ........... *H02M 1/32* (2013.01); *H02M 1/0009* (2021.05); *H02M 1/08* (2013.01); *H02M 5/458* (2013.01)

(58) Field of Classification Search
CPC ........ H02M 1/32; H02M 1/0009; H02M 1/08; H02M 5/458
See application file for complete search history.

(56) References Cited

U.S. PATENT DOCUMENTS 9,602,012 B2 * 3/2017 Kawashima ............ H02M 1/32
10,075,073 B2 * 9/2018 Guan ....................... G05F 1/46
(Continued)

FOREIGN PATENT DOCUMENTS

CN 206313748 U * 7/2017
JP H09322530 A 12/1997
(Continued)

OTHER PUBLICATIONS

Office Action for related Korean Application No. 10-2019-0089982; action dated Sep. 19, 2023; (5 pages).
(Continued)

*Primary Examiner* — Adolf D Berhane
(74) *Attorney, Agent, or Firm* — K&L Gates LLP

(57) ABSTRACT

Disclosed are an overcurrent protection device and a power conversion device using same. A power conversion device according to an embodiment of the present disclosure comprises: a control unit for providing a collector-emitter voltage to a switching element by means of a first output node; and an overcurrent protection circuit connected in a line between the first output node and the switching element and for limiting the overcurrent of the switching element.

9 Claims, 4 Drawing Sheets

(51) Int. Cl.
*H02M 1/08* (2006.01)
*H02M 5/458* (2006.01)

(56) References Cited

U.S. PATENT DOCUMENTS

| | | |
|---|---|---|
| 2007/0223164 A1 | 9/2007 | Oki et al. |
| 2013/0083442 A1* | 4/2013 | Hiyama ............ H03K 17/0828 |
| | | 361/93.7 |
| 2014/0009134 A1 | 1/2014 | Bernardon et al. |
| 2018/0183425 A1 | 6/2018 | Chae et al. |

FOREIGN PATENT DOCUMENTS

| | | |
|---|---|---|
| JP | 2010288416 A | 12/2010 |
| JP | 2013165578 A | 8/2013 |
| KR | 20010073796 A | 8/2001 |
| KR | 1020120130934 A | 12/2012 |
| KR | 20140038773 A | 3/2014 |
| KR | 1020180022454 A | 3/2018 |

OTHER PUBLICATIONS

Office Action for related Japanese application No. 2022-504723; action dated Jan. 17, 2023; (6 pages).
International Search Report for related International Application No. PCT/KR2020/003438; report dated Jan. 28, 2021; (5 pages).
Written Opinion for related International Application No. PCT/KR2020/003438; report dated Jan. 28, 2021; (5 pages).

* cited by examiner

OVERCURRENT PROTECTION DEVICE AND POWER CONVERSION DEVICE USING SAME

CROSS-REFERENCE TO RELATED APPLICATION

The present application is a National Stage of International Application No. PCT/KR2020/003438 filed on Mar. 12, 2020, which claims priority to and the benefit of Korean Patent Application No. 10-2019-0089982, filed on Jul. 25, 2019, the disclosure of which is incorporated herein by reference in its entirety.

FIELD

The present disclosure relates to an overcurrent protection device and a power conversion device using the same.

BACKGROUND

Generally, a power conversion device is a device which converts any power into power having a different current, a voltage, and a frequency and is represented by an inverter, which electrically converts a direct current (DC) to an alternating current (AC), and a converter which converts an AC into a DC.

FIG. 1 is a circuit block diagram of a general power conversion device that shows an inverter.

A power conversion device 100 receives three-phase AC power, a rectifier 110 rectifies the three-phase AC power, and a smoothing part 120 smooths and stores a DC voltage rectified by the rectifier 110. An inverter 130 outputs an AC voltage having a predetermined voltage and frequency that is inverted from the DC voltage stored in a DC link capacitor, which is a smoothing part 120, according to a pulse width modulation (PWM) control signal and provides the AC voltage to a motor.

In this case, in the inverter 130, a plurality of switching elements are disposed according to a predetermined topology, and each switching element is connected to a gate controller to receive a PWM control signal from a corresponding gate controller.

FIG. 2 is an exemplary diagram for describing an operation of the gate controller that shows a circuit which performs a cut-off operation according to a collector-emitter voltage $V_{CE}$ of the switching element and employs a resistor and a diode as a monitoring part 210.

The resistor and the diode of the monitoring part 210 monitor a saturation level of the collector-emitter voltage $V_{CE}$ of the switching element of the inverter 130, and when an overcurrent is detected, the resistor and the diode notify the gate controller 200 of the detection of the overcurrent.

When the overcurrent is detected, the gate controller 200 cuts off an output voltage and provides a fault signal to an upper controller.

In a circuit of the gate controller, a plurality of diodes or Zener diodes are connected to the switching element in series so as to reduce a cut-off detection threshold voltage.

FIG. 3 is a diagram for describing that a plurality of diodes are connected so as to reduce a cut-off detection threshold voltage, and FIG. 4 is a diagram for describing that a Zener diode is connected so as to reduce a cut-off detection threshold voltage.

Referring to FIG. 3, a voltage is dropped by the plurality of diodes, and thus a voltage threshold value of the switching element is changed. Referring to FIG. 4, a voltage is dropped by the diode and the Zener diode, and thus a voltage threshold value of the switching element is changed.

However, in the former case, when the number of diodes is increased, there is a problem in that a temperature deviation is increased to affect the circuit, and in the latter case, when the output current of the gate controller is small, there is a problem in that the Zener diode does not reach a breakdown voltage, and thus a voltage error becomes large.

SUMMARY

The present disclosure is directed to providing an overcurrent protection device which corrects a voltage threshold value of a gate controller using a simplified configuration, and a power conversion device using the same.

One aspect of the present disclosure provides an overcurrent protection device including a controller configured to provide a collector-emitter voltage to a switching element through a first output node, and an overcurrent limit circuit disposed between and connected to the first output node and the switching element in series and configured to limit an overcurrent of the switching element.

The controller may provide a pulse width modulation (PWM) control signal to a gate of the switching element through a second output node.

The overcurrent protection circuit may include a first diode of which a first output is connected to the first output node and a second output is connected to the switching element and which is disposed between and connected to the first output node and the switching element in series, a first resistor, and a second resistor, wherein the first resistor and the second resistor connected in series may be connected to the first diode in parallel, and a node between the first resistor and the second resistor may be connected to a third output of the first diode.

The overcurrent protection circuit may include a shunt regulator.

The overcurrent protection device may further include a monitoring part disposed between the overcurrent protection circuit and the switching element and configured to monitor an overcurrent flowing to the switching element.

The monitoring part may include a third resistor and a second diode which are connected in series.

When an overcurrent is detected by the monitoring part, the controller may block the PWM control signal.

When a voltage of the first output node is greater than or equal to a predetermined level, the controller may block the PWM control signal.

Another aspect of the present disclosure provides a power conversion device including a direct-current (DC) voltage provider configured to provide a DC voltage, a plurality of switching elements, each of which are turned on/off according to a pulse width modulation (PWM) control signal so that the DC voltage is converted and output, a controller configured to provide the PWM control signal to a gate of each of the plurality of switching elements through a first output node and provide a collector-emitter voltage to each of the plurality of switching elements through a second output node, and an overcurrent limit circuit disposed between and connected to the first output node and the switching element in series and configured to limit an overcurrent of the switching element.

The overcurrent protection circuit may include a diode of which a first output is connected to the first output node and a second output is connected to the switching element and which is disposed between and connected to the first output node and the switching element in series, a first resistor, and a second resistor, wherein the first resistor and the second resistor connected in series may be connected to the diode in parallel, and anode between the first resistor and the second resistor may be connected to a third output of the diode.

The overcurrent protection circuit may include a shunt regulator.

Still another aspect of the present disclosure provides a power conversion device including a direct-current (DC) voltage provider configured to provide a DC voltage, a plurality of switching elements, each of which are turned on/off according to a pulse width modulation (PWM) control signal, and configured to convert and output the DC voltage, a controller configured to provide the PWM control signal to a gate of each of the plurality of switching elements through a first output node and provide a collector-emitter voltage to each of the plurality of switching elements through a second output node, and an overcurrent limit circuit disposed between and connected to the first output node and the switching element in series and configured to limit an overcurrent of the switching element.

The power conversion device may include a diode of which a first output is connected to the first output node and a second output is connected to the switching element and which is disposed between and connected to the first output node and the switching element in series, a first resistor, and a second resistor, wherein the first resistor and the second resistor connected in series may be connected to the diode in parallel, and anode between the first resistor and the second resistor may be connected to a third output of the diode.

The overcurrent protection circuit may include a shunt regulator.

In accordance with the present disclosure, there are effects in which a magnitude of an overcurrent detection threshold voltage can be easily adjusted using a characteristic of a shunt regulator capable of adjusting a voltage using a resistor, and it is possible to accurately set a threshold voltage by reducing an error due to external factors such as a temperature and the like.

DESCRIPTION OF REFERENCE NUMERALS

| 10: switching element | 20: monitoring part |
|---|---|
| 40: controller | 50: overcurrent protection circuit |

DETAILED DESCRIPTION

In order to fully convey a configuration and an effect of the present disclosure, exemplary embodiments of the present disclosure will be described with reference to the accompanying drawings. However, the present disclosure is not limited to the embodiments described below, but may be implemented in various forms and various modifications may be made. However, the description of the present embodiment is intended to provide a complete disclosure of the present disclosure and to fully disclose the scope of the present disclosure to a person ordinary skilled in the art to which the present disclosure belongs. In the accompanying drawings, components are enlarged in size for convenience of description, and a scale of each of the components can be exaggerated or reduced.

The terms "first," "second," and the like can be used to describe various components, but the components should not be limited by these terms. These terms may be used only for the purpose of distinguishing one component from another component. For example, without departing from the scope of the present disclosure, a first component may be referred to as a second component, and similarly, the second component may also be referred to as the first component. In addition, the singular form includes the plural form unless the context clearly notes otherwise. Unless otherwise defined, the terms used in the embodiments of the present disclosure may be construed as commonly known to those skilled in the art.

Hereinafter, an overcurrent protection circuit and a power conversion device using the same according to embodiments of the present disclosure will be described with reference to the accompanying drawings.

Figure 5:
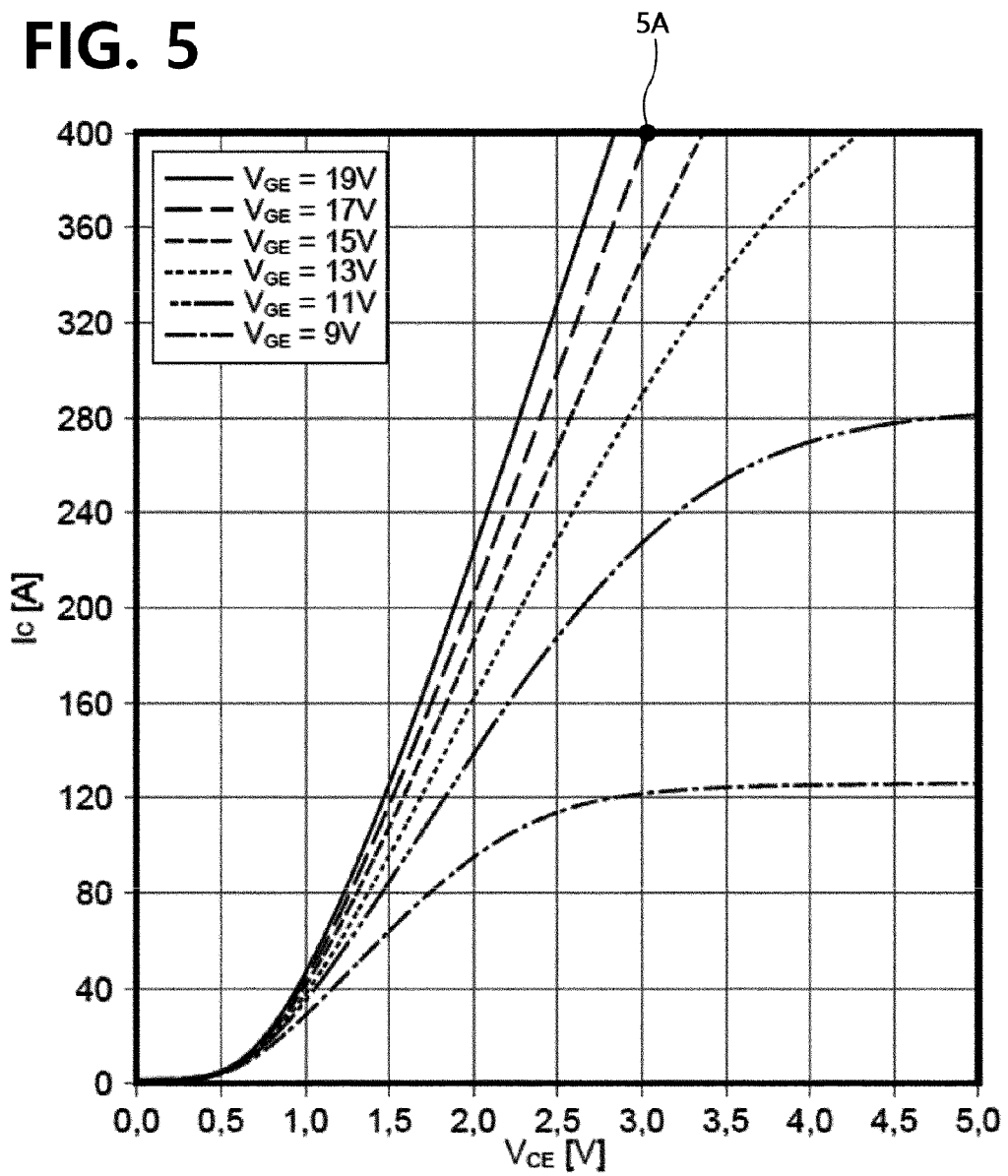
FIG. 5 is an exemplary diagram for describing a characteristic of a switching element used in a power conversion device.

FIG. 5 is an exemplary diagram for describing a characteristic of a switching element used in a power conversion device that shows a characteristic when an insulated gate bipolar transistor (IGBT) is used as the switching element. The switching element may be used in various power conversion devices such as an inverter or a converter.

As shown in the drawing, a collector current $I_C$ versus a collector-emitter voltage $V_{CE}$ according to a gate-emitter voltage $V_{GE}$ is shown. Due to the characteristic of the IGBT device, an overcurrent detection threshold value may be set to 400 A.

For example, in FIG. 5, when a gate-emitter voltage $V_{GE}$ is 15 V and a collector current $I_C$ is a threshold value of 400 A, A shows that a collector-emitter voltage $V_{CE}$ is 3.25 V. That is, when the overcurrent detection threshold value is set to 400 A and the gate-emitter voltage $V_{GE}$ is 15V, the collector-emitter voltage $V_{CE}$ may be 3.25 V.

Figure 6:
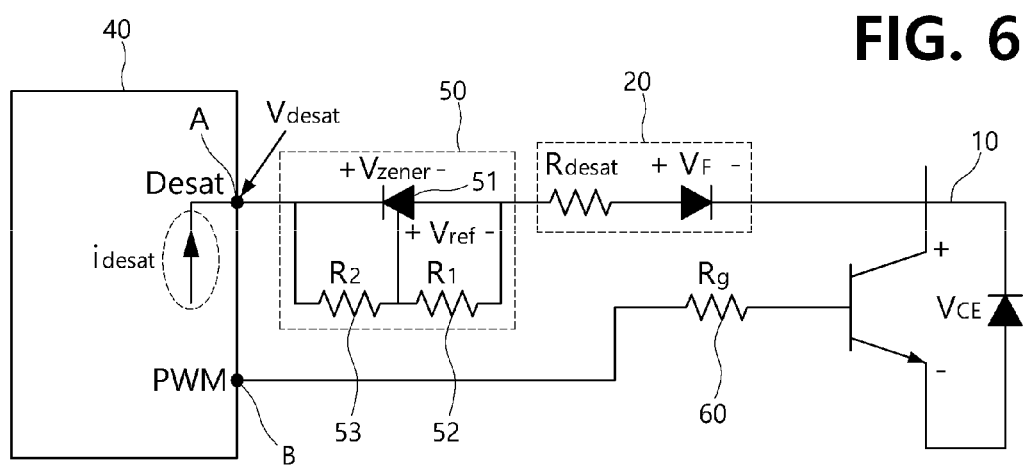
FIG. 6 is an exemplary diagram for describing an overcurrent protection circuit of the power conversion device according to one embodiment of the present disclosure.

FIG. 6 is an exemplary diagram for describing an overcurrent protection circuit according to one embodiment of the present disclosure.

As shown in the drawing, the overcurrent protection circuit of one embodiment of the present disclosure is configured to protect a switching element 10 of an inverter 130 and may include a monitoring part 20, a controller 40, and an overcurrent limit circuit 50.

Referring to FIGS. 6 and 5, when a voltage $V_{desat}$ output from an output node A of the controller 40 exceeds 9.25 V, the controller 40 may output a fault signal and block an output node B so as to prevent a PWM signal from being output. In addition, the controller 40 may transmit that the fault signal is output to an upper controller (not shown), thereby controlling an operation of the power conversion device to be turned off.

In one embodiment of the present disclosure, when the voltage $V_{desat}$ exceeds 9.25 V, the controller 40 outputs the fault signal, and thus the overcurrent limit circuit 50 and the monitoring part 20 drop a voltage of 6 V excluding a voltage of 3.25 V and apply the voltage of 3.25 V to the switching element 10.

A resistor $R_{desat}$ and a diode of the monitoring part 20 have predetermined values, and $V_{zener}$ of the overcurrent limit circuit 50 may be determined by resistors $R_1$ and $R_2$ connected to a diode 51 in the form of a shunt regulator.

That is, in other words, in the circuit of FIG. 6, the voltage $V_{desat}$ may be determined as follows.

$$V_{desat} = V_{zener} + (i_{desat} \times R_{desat}) + V_F + V_{CE} \quad \text{[Equation 1]}$$

$V_{CE}$, $V_F$, $R_{desat}$, and $i_{desat}$ are predetermined, and $V_{zener}$ may be obtained by the following equation.

$$V_{zener} = V_{ref}(1 + (R_2/R_1)) \quad \text{[Equation 2]}$$

In one embodiment of the present disclosure, in the overcurrent limit circuit 50, the first resistor 52 and the second resistor 53 connected in series are connected parallel to the diode 51 connected to the output node A in series, and a node between the first resistor 52 and the second resistor 53 may be connected to a third output terminal of the diode 51.

However, in one embodiment of the present disclosure, although an example in which the diode 51 is used as an element connected to the output node A in series has been described, a Zener diode may be used.

Due to the above circuit configuration, the overcurrent limit circuit 50 constitutes a shunt regulator, and a voltage applied to the diode 51 may be determined according to a reference voltage $V_{ref}$ applied to the first resistor 52 and resistance values of the first and second resistors 52 and 53 as shown in Equation 2.

Generally, the shunt regulator is a circuit which maintains a constant voltage and refers to a circuit in which the reference voltage $V_{ref}$ is constant and which is capable of varying an overall voltage using resistance values of resistors connected in series.

According to one embodiment of the present disclosure, since the shunt regulator is used as the overcurrent limit circuit 50, a magnitude of an overcurrent detection threshold voltage may be easily adjusted, and an error due to external factors, such as a temperature and the like, may be reduced to set an accurate threshold voltage.

Meanwhile, the resistor $R_{desat}$ and the diode of the monitoring part 20 may monitor a saturation level of the collector-emitter voltage $V_{CE}$ of the switching element 10, and when an overcurrent is detected, the monitoring part 20 may notify the controller 40 of the overcurrent detection. Due to the overcurrent detection, the controller 40 may transmit a fault signal to the upper controller (not shown) of the power conversion device.

In addition, the controller 40 may provide a PWM control signal to a gate of the switching element 10 through a third resistor $R_g$ 60 connected to the output node B.

When the fault signal is generated due to the overcurrent detection, the controller 40 may block an output of the PWM control signal to control an operation of the switching element 10 to be stopped. In addition, when the voltage $V_{desat}$ of the output node A is greater than or equal to a predetermined level (e.g., 9.25 V) in addition to the overcurrent detection, the controller 40 may block the output of the PWM control signal through the output node B to control the operation of the switching element 10 to be stopped.

Magnitudes of the above described numbers are illustrative, and it is obvious that the magnitudes of the above described numbers may be variously set according to elements of the circuit.

With the above described circuit configuration according to one embodiment of the present disclosure, a magnitude of an overcurrent detection threshold voltage may be easily adjusted using a characteristic of a shunt regulator capable of adjusting a voltage using a resistor, and it is possible to accurately set a threshold voltage by reducing an error due to external factors such as a temperature and the like.

Figure 1:
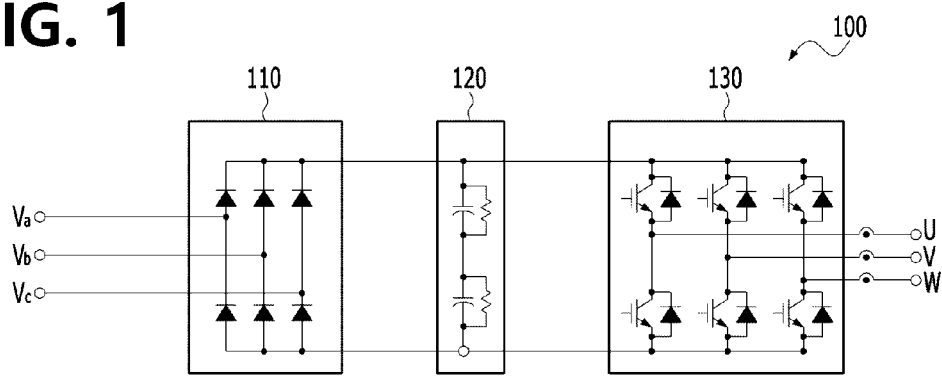
FIG. 1 is a circuit block diagram illustrating a general power conversion device.
Figure 2:
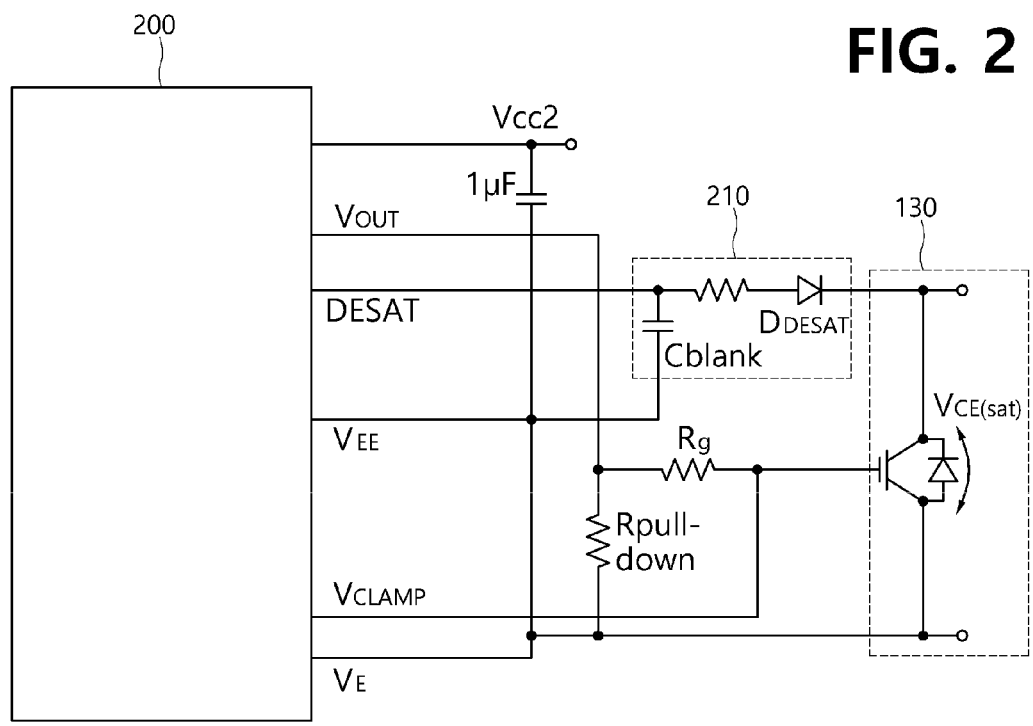
FIG. 2 is an exemplary diagram for describing an operation of a gate controller.
Figure 3:
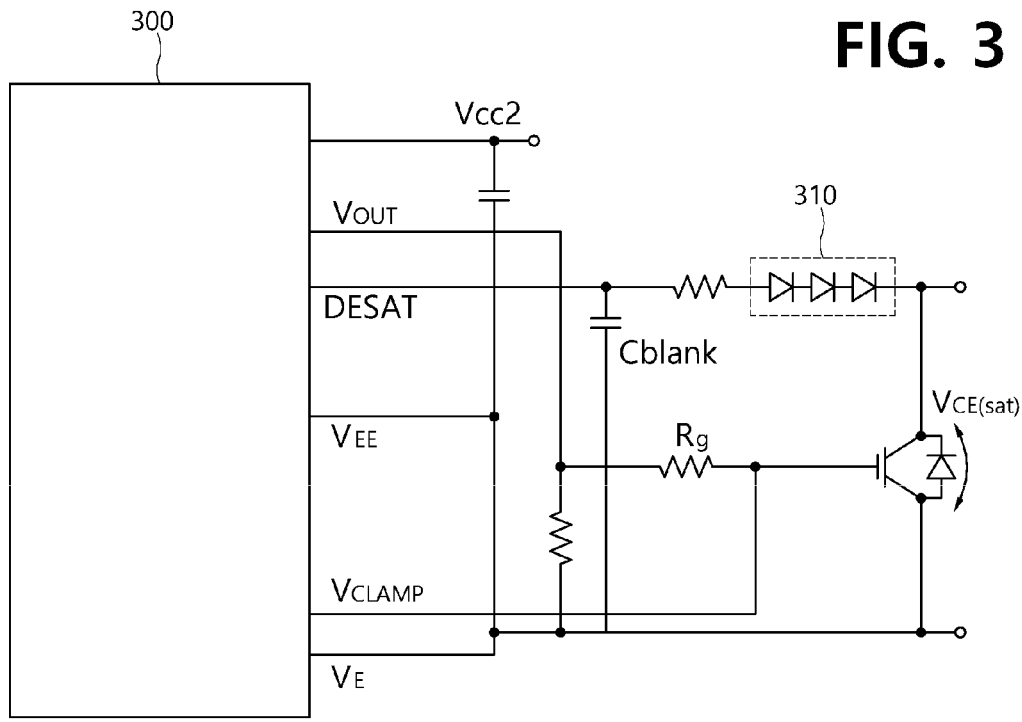
FIG. 3 is a diagram for describing that a plurality of diodes are connected so as to reduce a cut-off detection threshold voltage.
Figure 4:
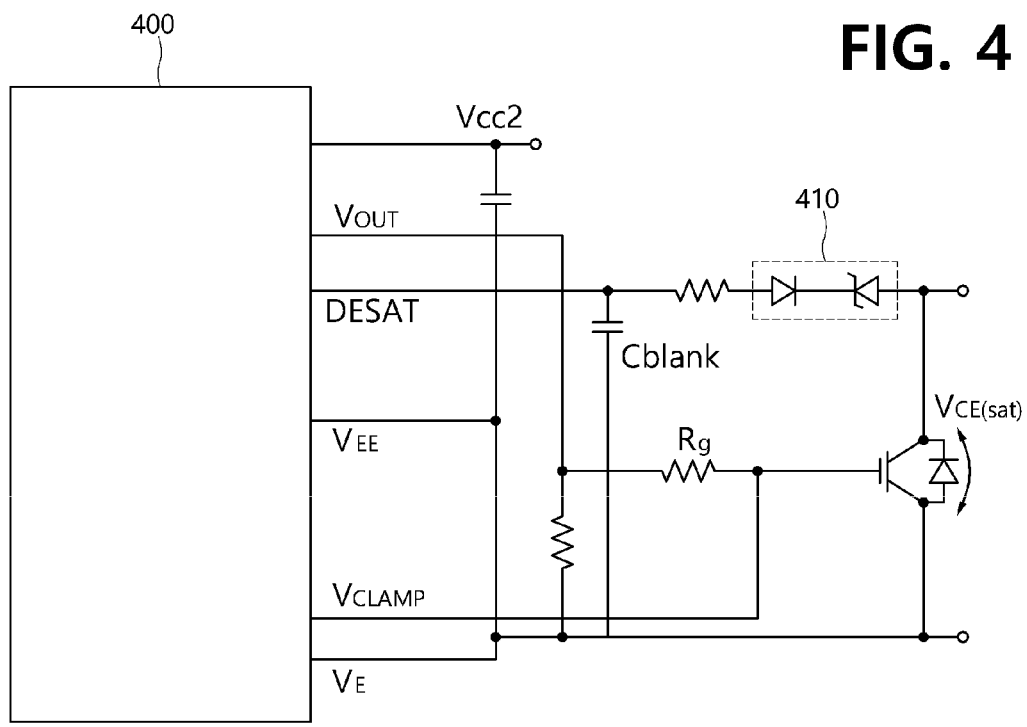
FIG. 4 is a diagram for describing that a Zener diode is connected so as to reduce a cut-off detection threshold voltage.

That is, when compared with the use of the plurality of diodes connected in series as shown in FIG. 3, a sensing voltage may be accurately set using a small number of elements, and a deviation according to a temperature may be reduced. In addition, when compared with the use of the Zener diode as shown in FIG. 4, when a small current flows, it is possible to solve a problem of not reaching a breakdown voltage so that it is difficult to accurately drop a voltage.

While the present disclosure has been described with reference to embodiments thereof, the embodiments are merely illustrative and it should be understood that various modifications and equivalent embodiments can be derived by those who skilled in the art. Accordingly, the true technical scope of the present disclosure should be determined by the appended claims.

The present disclosure has industrial applicability in that a magnitude of an overcurrent detection threshold voltage can be easily adjusted using a natural law that a voltage is changed through a change in resistance.

The invention claimed is:

1. An overcurrent protection device comprising:
   a controller configured to provide a collector-emitter voltage to a collector terminal of switching element through a first output node; and
   an overcurrent limit circuit disposed between and connected to the first output node and the collector terminal of the switching element in series and provided with a shunt regulator configured to limit an overcurrent supplied to the switching element by supplying a constant voltage.

2. The overcurrent protection device of claim 1, wherein the controller provides a pulse width modulation (PWM) control signal to a gate of the switching element through a second output node.

3. The overcurrent protection device of claim 2, wherein the overcurrent limit circuit includes:
   a first diode of which a first output is connected to the first output node and a second output is connected to the switching element and which is disposed between and connected to the first output node and the switching element in series;
   a first resistor; and
   a second resistor,
   wherein the first resistor and the second resistor connected in series are connected to the first diode in parallel, and
   a node between the first resistor and the second resistor is connected to a third output of the first diode.

4. The overcurrent protection device of claim 3, further comprising a monitoring part disposed between the overcurrent limit circuit and the switching element and configured to monitor an overcurrent flowing to the switching element.

5. The overcurrent protection device of claim 4, wherein, when an overcurrent is detected by the monitoring part, the controller blocks the PWM control signal.

6. The overcurrent protection device of claim 4, wherein the monitoring part includes a third resistor and a second diode which are connected in series.

7. The overcurrent protection device of claim 6, wherein, when an overcurrent is detected by the monitoring part, the controller blocks the PWM control signal.

8. A power conversion device comprising:
- a direct-current (DC) voltage provider configured to provide a DC voltage;
- a plurality of switching elements, each of which are turned on/off according to a pulse width modulation (PWM) control signal so that the DC voltage is converted and output;
- a controller configured to provide the PWM control signal to a gate of each of the plurality of switching elements through a first output node and provide a collector-emitter voltage to each of the plurality of switching elements through a second output node; and
- an overcurrent limit circuit disposed between and connected to the first output node and a collector terminal of the switching element in series and including a shunt regulator for providing a constant voltage configured to limit an overcurrent of the switching element.

9. The power conversion device of claim 8, wherein the overcurrent limit circuit includes:
- a diode of which a first output is connected to the first output node and a second output is connected to the switching element and which is disposed between and connected to the first output node and the switching element in series;
- a first resistor; and
- a second resistor,
- wherein the first resistor and the second resistor connected in series are connected to the diode in parallel, and
- a node between the first resistor and the second resistor is connected to a third output of the diode.

* * * * *